United States Patent [19]

Pearce

[11] Patent Number: 5,777,362
[45] Date of Patent: Jul. 7, 1998

[54] HIGH EFFICIENCY QUASI-VERTICAL DMOS IN CMOS OR BICMOS PROCESS

[75] Inventor: Lawrence George Pearce, Palm Bay, Fla.

[73] Assignee: Harris Corporation, Palm Bay, Fla.

[21] Appl. No.: 474,559

[22] Filed: Jun. 7, 1995

[51] Int. Cl.$^6$ .............................. H01L 29/76; H01L 27/01
[52] U.S. Cl. ........................ 257/335; 257/337; 257/339; 257/347; 257/351; 257/352; 257/354
[58] Field of Search ..................................... 257/335, 337, 257/339, 347, 351, 352, 354

[56] References Cited

U.S. PATENT DOCUMENTS

| H1435 | 5/1995 | Cherne et al. ........................ 257/347 |
|---|---|---|
| 4,214,359 | 7/1980 | Kahng ........................ 29/571 |
| 4,313,126 | 1/1982 | Krumm et al. . | |
| 4,554,512 | 11/1985 | Aiello . | |
| 4,589,004 | 5/1986 | Yasuda et al. ........................ 257/337 |
| 5,191,396 | 3/1993 | Lidow ........................ 257/339 |
| 5,256,893 | 10/1993 | Yasuoka . | |
| 5,317,182 | 5/1994 | Zambrano et al. ........................ 257/337 |
| 5,387,875 | 2/1995 | Tateno . | |
| 5,430,316 | 7/1995 | Contiero et al. ........................ 257/339 |
| 5,432,370 | 7/1995 | Kitamura et al. ........................ 257/339 |
| 5,541,429 | 7/1996 | Shibib ........................ 257/339 |

FOREIGN PATENT DOCUMENTS

| 0 525 777 A1 | 2/1993 | European Pat. Off. . | |
|---|---|---|---|
| 0557 253 | 8/1993 | European Pat. Off. . | |
| 0 655 830 A1 | 5/1995 | European Pat. Off. . | |
| 42 09 148 | 10/1992 | Germany . | |
| 0159868 | 3/1989 | Japan ........................ 257/339 |
| 5267675 | 10/1993 | Japan . | |

OTHER PUBLICATIONS

European Search Report mailed Sep. 12, 1996.
PCT Communication mailed Oct. 15, 1996.
A. Watson Swager, "Power Ics weighing The Benefits Of Integration", EDN-Electrical Design News, vol. 39, No. 14, Newton, MA, Jul. 1994, pp. 68-72, 74, 76, 78, 80, 82.

Primary Examiner—Mahshid D. Saadat
Assistant Examiner—Valencia Martin Wallace
Attorney, Agent, or Firm—Jaeckle Fleischmann & Mugel, LLP

[57] ABSTRACT

A QVDMOS array 10 has QVDMOS devices with a silicide contact 42 to source 35 and body tie 36. The body tie 36 is enclosed by the source at the surface and extends beneath but not beyond the annular source 35. The QVDMOS is formed during a number of process steps that simultaneously form regions in NMOS, PMOS and bipolar devices.

22 Claims, 4 Drawing Sheets

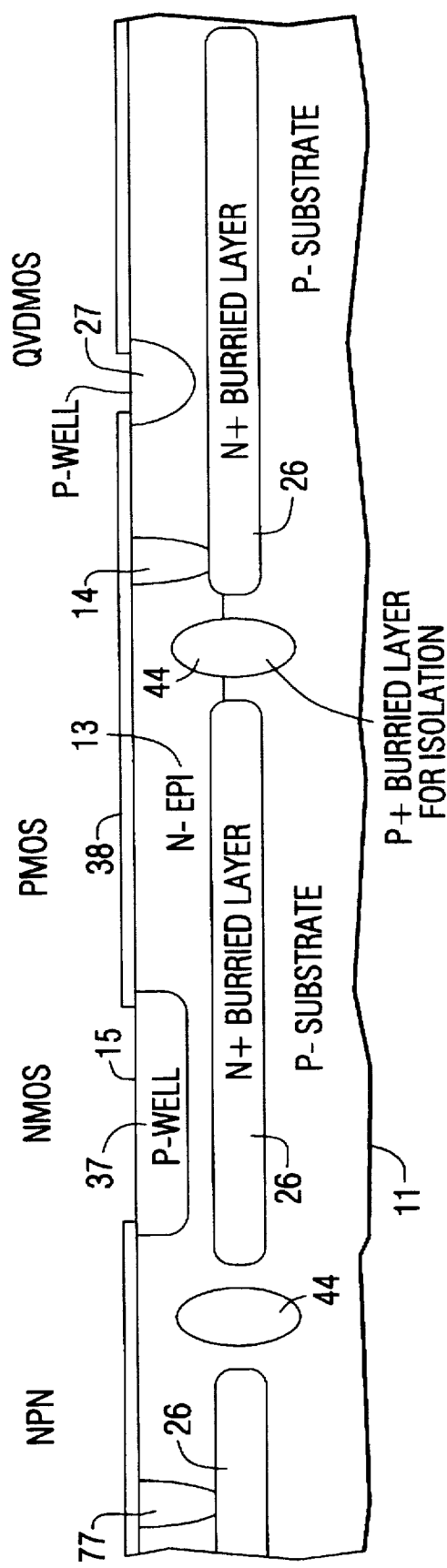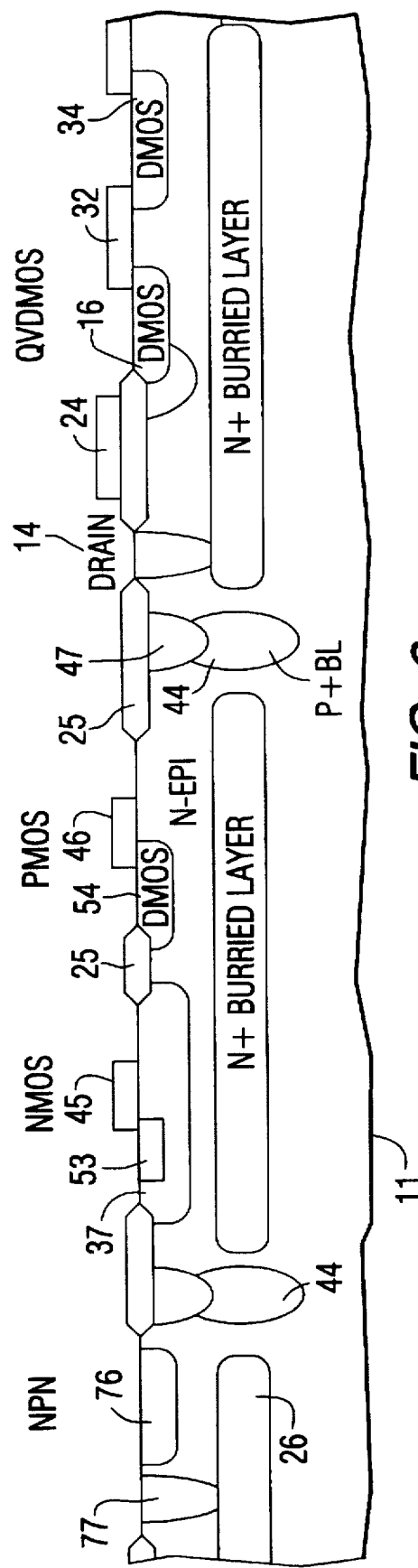
FIG. 5
FIG. 6

HIGH EFFICIENCY QUASI-VERTICAL DMOS IN CMOS OR BICMOS PROCESS

BACKGROUND

This invention relates in general to quasi-vertical DMOS devices and, in particular, to a new QVDMOS device and a method for integrating manufacture of a QVDMOS device and QVDMOS array into the manufacture of other MOS and bipolar transistors.

The invention of the integrated circuit made it possible to put many transistors on a single substrate and thereby incorporate complex electrical circuits into a single device. Integrated circuits have found particular application with logic devices and other control circuits that operate at generally low voltages and carry very small currents. However, semiconductor technology is also effective in providing discrete devices for handling very high voltages and very large currents. Discrete devices generally include a vertical current path so that current passes from the surface through the body of the substrate to a contact located on the back of the substrate. Such a vertical current path effectively precludes integration of power devices with other devices. Since the back surface of the substrate is used, there has to be a common contact among all devices on the substrate. Thus, individual transistors on the substrate cannot be effectively isolated from each other. In contrast, many integrated circuits do not use the back side of a substrate for a current path. Instead, integrated circuits normally grow an epitaxial layer on the substrate. The substrate has a buried layer that establishes lateral contact. Surface diffusions down to the buried layer through the epitaxial layer establish the completed circuit.

Accordingly, there has been a long felt need to combine integrated circuits with epitaxial layers and power transistors. In partial fulfillment of this need, there has developed a particular type of power device known as the QVDMOS device. The QVDMOS power device does not use a back contact but instead uses an epitaxial layer, a highly conductive buried layer in the substrate, and a highly conductive sinker diffusion to the buried layer to establish the current path through the QVDMOS.

However, existing QVDMOS technology has many defects that limit its widespread integration with low voltage, low current CMOS logic devices. For example, in a typical QVDMOS array both the source and the body tie must have relatively large areas to accommodate a metal contact. Unless the metal intimately contacts both the source and the body tie over a substantial portion of the surface of the source and the body tie region, the QVDMOS will develop hot spots and will otherwise not be able to carry the current and sustain the relatively high (60 volts) breakdown voltage that is typical and expected of such QVDMOS devices. In order to make intimate contact, existing QVDMOS devices have larger source, larger body tie, and larger body diffusion than are used in CMOS devices. Thus, the relatively large QVDMOS diffusions that are normally made at different concentrations and different ion implant energies render it impractical to incorporate QVDMOS devices together with CMOS and bipolar devices into a single process for manufacturing intelligent power with control logic as well as power handling devices.

Accordingly, there has arisen a long felt need for an effective QVDMOS transistor and method of fabrication that would be compatible with CMOS and bipolar processes so that the QVDMOS transistor and a QVDMOS transistor array could be manufactured simultaneously with CMOS and bipolar transistors.

SUMMARY

The invention provides a quasi-vertical DMOS transistor (QVDMOS) together with a method for its manufacture either alone or in combination with other transistors such as PMOS transistors, NMOS transistors and bipolar transistors. The QVDMOS transistor is constructed on the substrate of a first type of conductivity, usually P-type material. The substrate has a highly doped buried layer of a second or N-type conductivity. An epitaxial layer is disposed above the buried layer and comprises a light doping of a second or N-type conductivity. A drain sinker region of heavily doped second or N-type conductivity extends from the surface of the epitaxial layer to the buried layer. A body region of a first or P-type conductivity is formed in the surface of the epitaxial layer and space from the drain. A source region, preferably an annular source region, is formed in the body region. The source region is formed with a shallow implant of a second or N-type conductivity and has a relatively shallow depth. A body tie is formed in the opening in the source region and has a first or P-type conductivity. The depth of the body tie is slightly greater than the depth of the source region. The body tie extends beneath the source region but not beyond the source region and thereby reduces the pinching effect between the N epi layer and the N-type source region. A gate is disposed over the source region of the body region for selectively establishing a current path from the drain to the source. The gate is provided with sidewall spacers that are used to position the body tie diffusion so that the outer limits of the body tie diffusion are less than the outer limits of the source diffusion. The source and body tie regions are silicided thereby greatly reducing the size of the diffusions needed for the source and the body tie as well as reducing the size of the opening needed to contact the source and the body tie. In a similar manner, the gate, typically made of polysilicon, is also silicided.

It is contemplated that the inventive QVDMOS device may be fabricated simultaneously with other transistors including NMOS transistors, PMOS transistors and bipolar transistors. Such fabrication of a power DMOS together with lower power logic and control transistors is highly desirable. It enables the user to have both the controls and logic for a circuit on the same substrate as the power devices that handle large currents. In such an integrated power and logic circuit, often referred to as an intelligent power circuit, the inventive QVDMOS can be readily integrated into the normal process flow of the CMOS and bipolar transistors without requiring separate steps. In particular, during the formation of the NMOS P well, it is possible to simultaneously form the source-drain P well termination for the QVDMOS device. Likewise, the typical N+ sinker for the QVDMOS drain may also form the surface collector contact for a bipolar transistor. Later in the process, the P-type implant used to form the QVDMOS body may also simultaneously form the lightly doped drain portions of the PMOS transistors and can also be used to provide the base of the bipolar transistor. The shallow N+ implant that forms the source of the QVDMOS transistor simultaneously forms the shallow N+ body tie for the PMOS transistor, the shallow sources and drains for the NMOS transistors. That shallow N+ implant may also form the emitter of the bipolar transistor. Finally, the shallow P+ body tie for the QVDMOS body may also be used to form the source and drain of the PMOS devices as well as the body tie for the NMOS device.

Having thus summarized the invention, those skilled in the art are referred to the attached drawings and the following detailed description for a further understanding of the invention.

DESCRIPTION OF THE DRAWINGS

FIG. 5 is a partial cross-sectional view showing the formation of P-wells in CMOS and QVDMOS devices;

FIG. 6 is a cross-sectional view similar to FIG. 5 showing the simultaneous formation of the PMOS slightly doped drain and the DMOS body;

DETAILED DESCRIPTION

Figure 1:
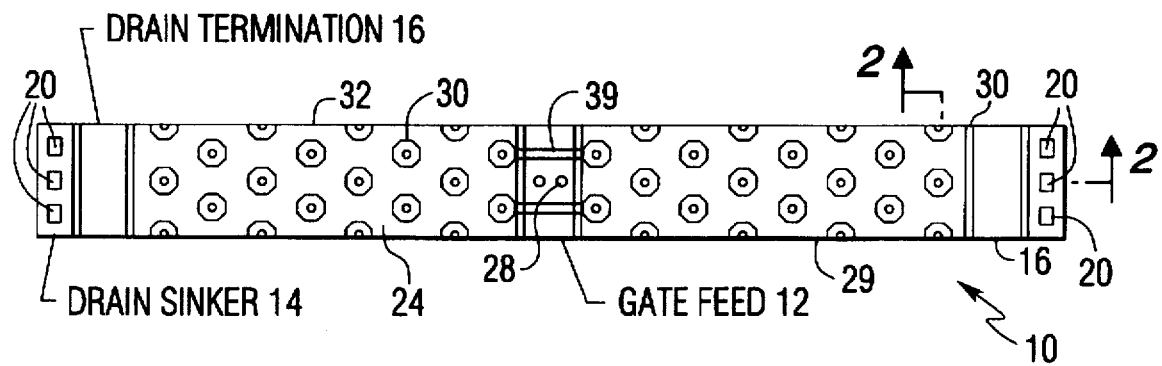
FIG. 1 is a partial plan view of a QVDMOS array.

Turning to FIG. 1, there is shown a portion of a QVDMOS array 10. The QVDMOS array 10 is a portion of an integrated circuit, not shown, that also includes NMOS devices, PMOS devices and bipolar devices. The array 10 has a plurality of octagonal shaped source cells 30 that are identical to one another. A metal gate feed 12 runs down the center of the array 10 and contacts gate 24 comprising a gate metal 29 on a thin gate oxide 32. Beneath the gate feed 12 are extended sources 39 having a dogbone-like shape. The sources 39 located beneath the gate feed 12 are elongated so as to maintain the overall symmetry between sources 30 and the gate 29. On both ends of the array 10 there are drains 20. The drains 20 are separated from the sources 30 by drain termination regions 16. A gate 29 is disposed between adjacent sources. Gate 29 is controlled by a voltage applied to the gate feed 12. The gate feed 12 has contact points 28 disposed along its length for receiving a control voltage signal.

Figure 2:
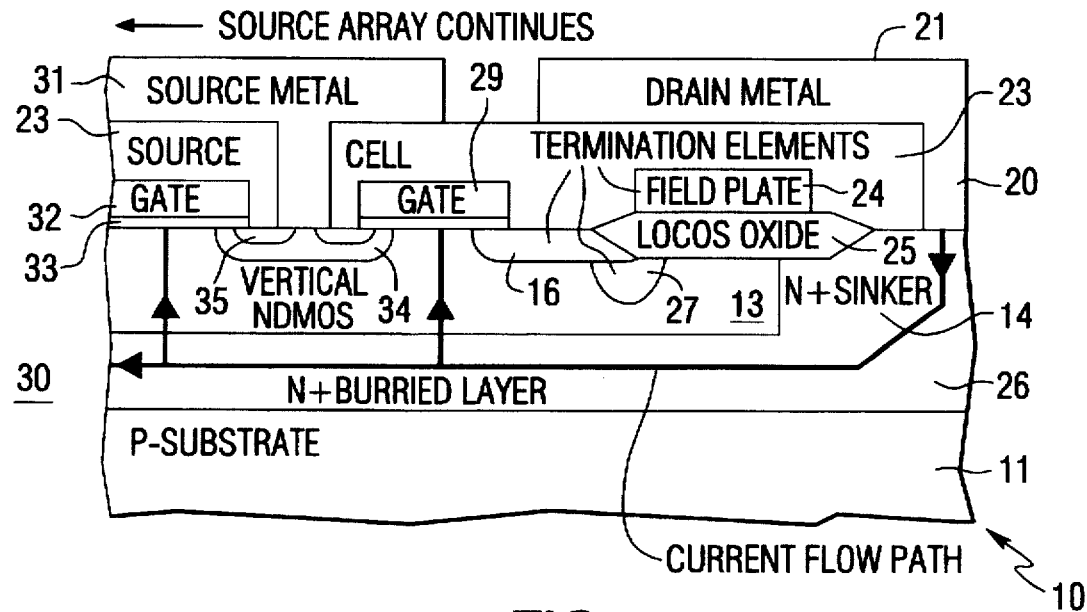
FIG. 2 is a cross-sectional view of the termination portion of the QVDMOS array.

With reference to FIG. 2, there is shown a typical source 30 adjacent a termination region 16. The source cell 30 is fabricated on a lightly doped P-type substrate 11. A heavily doped N+ buried layer 26 is formed in the surface of the substrate 11 in a manner well known in the art. In addition, the N+ buried layer may be formed in the particular manner described in co-pending application Ser. No. 08/472,859 filed Jun. 7, 1995 assigned to Harris Corporation. A heavily doped N+ sinker diffusion 14 provides a surface drain contact to the buried layer 26. The N+ sinker diffusion 14 is formed in a lightly doped N epitaxial layer 13 that is grown on the P-type substrate 11 in a manner well known in the art or as described in the copending application identified above. In the N epitaxial layer 13 there is formed a lightly P doped DMOS body region 34. A drain termination region 16, also lightly P doped, is formed at the same time as the DMOS body diffusion 34. Within the DMOS body 34 there is a shallow, heavily doped N-type source region 35. The N-type source region 35 has either a circular or hexagonal annular shape. As better shown in FIG. 3, within the annular region 35 there is a further heavily doped P-type body tie region 36 that extends beneath the N-type source region 35.

A gate oxide 32 surrounds the surface of the annular source region 35. Covering the gate oxide is a gate metal layer 29 comprising a heavily doped layer of polysilicon. An isolating oxide layer 23 separates the source 30 from the drain 20. Further isolation is provided by drain termination elements including a lightly doped P-type region 27 that is disposed between the gate 29 and a LOCOS oxide region 25. On top of the LOCOS oxide 25 is a field plate 24. A drain metal layer 21 contacts the N+ drain sinker diffusion 14. A source metal layer 31 contacts the body tie 36 and the source region 35 of the source cell 30.

Figure 3:
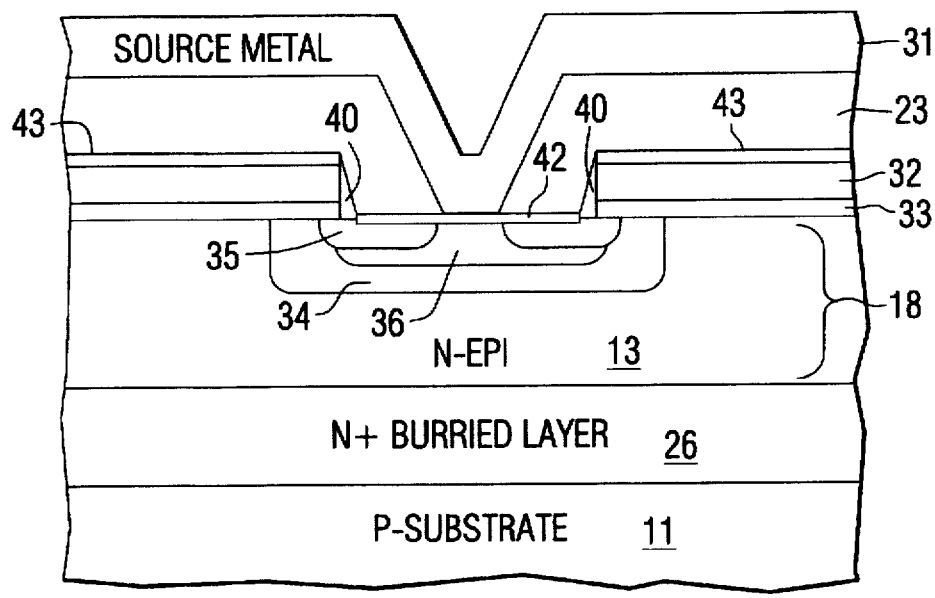
FIG. 3 is an enlarged cross-sectional view of a source cell of a QVDMOS array.

With reference to FIG. 3, further features of the source cell 30 are shown. There, it will be seen that the gate 29 has sidewall oxide spacers 40. Also, the surface of the source 30 between the oxide spacers 40 is silicide with a layer of silicide 42. It is optional that the gate polysilicon 32 also have a layer 43 of silicide.

Figure 4:
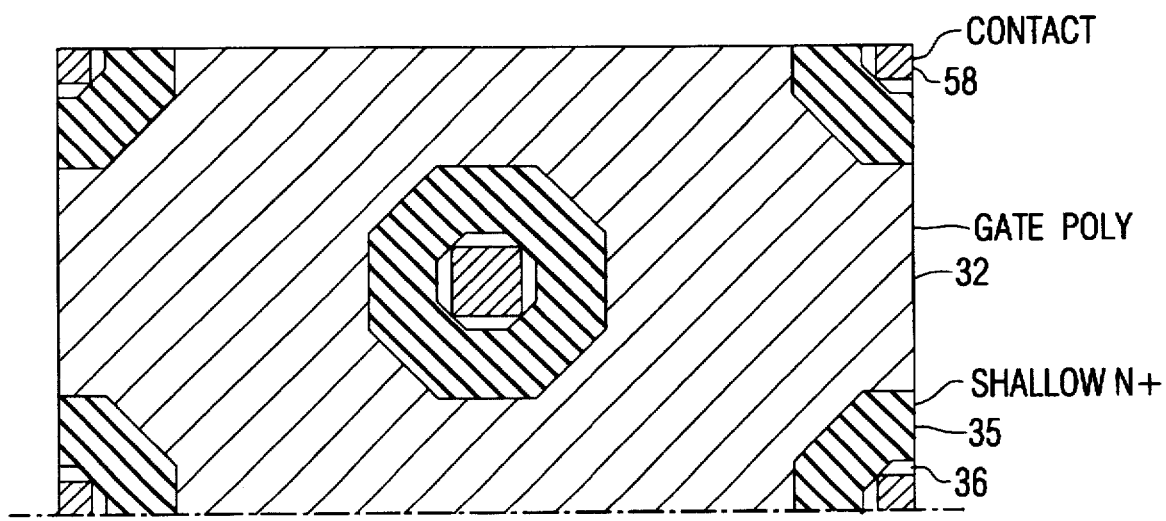
FIG. 4 is an enlarged plan view of a portion of the source array.

With reference to FIG. 4, there is shown how the gate polysilicon 32 surrounds the shallow N+ source region 35. The body tie region 36 is shown enclosed by the surface of the shallow N+ region 35. The source metal 31 makes contact to the silicide layer 42 (not shown) via the contact window 58 made in the dielectric layer 23.

In operation, when a positive voltage is applied to the gate, current will flow from the drain to the source. The current flow path is shown in FIG. 2. The current travels from the drain metal 21 through the sinker diffusion 14, the buried layer 26 and then through the epi layer 13 underneath the gate oxide 32 into the source region 35 through the silicide 42 and the source metal 31. The transit of current through the N epi layer 13 is known as the drift region 18. As such, when the QVDMOS device is on, its resistance is made up of the combined resistivities of the sinker 14, the buried layer 26, the N epi layer 13, the body region 34 and the source region 35.

One of the features of the invention is the silicide 42 on the source 35 and body tie 36 region. The use of a silicide on the body tie 36 and source 35 increases the efficiency of the QVDMOS array 10. With the silicide 42, it is no longer necessary to open a contact window the same size as the annular source region 35 as shown in FIG. 4. As such, the contact window 58 may be substantially smaller than the source region 35. The use of silicide 42 in contacting the body tie region effectively uncouples the placement of the body tie 36 from the location of the source metal 31. In prior art devices body tie contacts were made relatively large with respect to the body ties in order to provide sufficient area to insure positive metal contact to both the source and the body tie. Large contacts required larger source cell sizes, thereby reducing the overall efficiency of the source array 10. In other words, larger areas were needed to provide for suitable contacting of the body tie and source regions and these excess areas consumed valuable space on the integrated circuit without enhancing the performance of the device. However, by using silicide 42 to contact both the source 35 and the body tie 36, the body tie 36 may be efficiently placed in the center of the source region 35 and have a relatively small size.

By using the silicide layer 42, the source metal contact 31 does not have to contact the shallow N+ layer 35 that constitutes the QVDMOS source. Instead, the source metal contacts the silicide conductive layer 42 which in turn connects laterally to the shallow N+ layer 35. As a result, the QVDMOS source 30 may use a small contact opening for allowing metal 31 to contact the source. The only requirement of the contact is that it fall somewhere within the source window. Without the silicide layer 42, the source metal 31 would have to explicitly connect with both the shallow N+ layer 35 as well as the shallow P region 36 with sufficient area contact in order to keep contact resistance low. If silicide was not used, both of the regions 35 and 36 would have to be significantly larger.

With the silicide layer 42, the dimension of the shallow N+ layer 35 from the edge of the gate poly 29 to the opening in the center is minimized. This is quite important in reducing parasitic bipolar action in the source such as breakdown, snapback and dV/dt triggering. The sidewall spacer oxide 40 prevents the silicide from forming a short over the gate poly 29.

Another feature of the QVDMOS source cell is the self-alignment of the source region 35 and the body tie 36. The gate metal 29 and gate oxide 32 are placed on the surface 15 of the epitaxial layer 13. Then a light P-type diffusion or implant is made to form body region 34 in the epitaxial layer 13 in order to define the body 34 of the QVDMOS source cell 30. Next, the opening between the ends of the gate are masked with a body tie mask and the exposed region is implanted with a shallow N-type doping in order to form the source region 35. The source region 35 is then driven in and diffused to extend slightly underneath the gate oxide 32. Next, sidewall spacers 40 are formed by either oxide deposition or thermal oxide growth of the edges of the gate polysilicon 29. Sidewall spacers 40 offset a subsequent shallow P-type implant from the edges of the source diffusion 35. A shallow P-type implant is made into the source opening. In the region 35, the P-type ions are neutralized by the N+ ions. In the remaining area, a shallow P+ diffusion 36 is formed in the middle of the source 35. The P+ type diffusion 36 extends beneath the source 35 but not beyond the outer edges of the region 35.

All MOS transistors, both lateral and vertical, require a body tie to suppress parasitic NPN bipolar action from the source to the drain during breakdown or high dV/dt transitions. If the parasitic bipolar action is initiated, a QVDMOS device can switch to an unwanted conducting state and may be destroyed or may destroy the load. In the invention, the shallow P+ region 36 body tie also provides the body tie in NMOS devices and the source and drain for PMOS devices in a corresponding simultaneous formation of CMOS devices. Accordingly, the shallow P+ implant 32 is below the shallow N+ implant 35. As a result, the QVDMOS body resistance under the shallow N+ implant 35 is reduced from about 1,000 ohm/sq. without the shallow P+ implant 36 to between 320 and 200 ohm/sq. with the shallow P+ implant 36.

In addition, the shallow P+ implant serves to set the QVDMOS breakdown voltage by setting a more abrupt vertical doping profile than the diffused DMOS body 34. The sidewall spacers 40 extend about 300 nanometers from the polysilicon gate 29. The spacers shield the edges of the polysilicon material 29 during a subsequent silicide operation. The spacers 40 effectively displace the shallow P+ lateral profile 300 nanometer inside the outer edge of the shallow N+ diffusion 35, while the vertical profiles are referenced to the same surface. Since the vertical profiles set the breakdown, and the shallow P+ region 36 is constrained from the outer edges of the annular source diffusion 35, then the point of breakdown will be kept away from the gate oxide 33.

The shallow P+ body tie 36 also helps prevent snapback. The P+ layer 36 underneath the shallow N+ region 35 acts like a high quality junction. In effect, the shallow P+ region 36 reduces the pinching effect that is imposed upon the DMOS body 34 by the shallow N+ source region 35 and the N-type epi region 13. Both of those N-type regions pinch the effective resistance of the P-type DMOS body 34 and thereby increase its resistance. The shallow P+ layer 36 beneath the shallow N+ layer 35 reduces that resistance. However, it is important that the P+ layer 36 not wrap around the N+ diffusion 35 or else the threshold of the device would dramatically increase. This is insured by the oxide sidewall spacers 40 which keep the P+ region 36 from expanding beyond the boundaries of the N+ region 35.

Another feature of the invention is the enhancement of drain termination breakdown. It has been found that the P well 34 used to form the NMOS body is an ideal diffusion to use as a junction extension to increase the lateral breakdown voltage between the QVDMOS source array and the drain termination 16. In the source array 10, the result is that the drain termination breakdown is increased from 50 volts to about 80 volts by disposing a P well region 27 between the P-type body region 16 and the LOCOS oxide region 25. With the lateral breakdown voltage raised above the intrinsic source value, the QVDMOS performance can be optimized independently from lateral breakdown. For example, if no P well region 27 were used, the QVDMOS performance (i.e., when the QVDMOS is "on") would be compromised to achieve this high lateral breakdown.

Another advantage of the P well junction extensions 27, 18 over extensions used in typical discrete power processes is that the junctions 27, 18 may be implemented in the normal formation of the QVDMOS source array 30 and do not require any further masking step. As such, a narrow band of P wells 27, 18 to straddle the edge of LOCOS oxide 25. In this manner, the P wells 27, 18 are prevented from touching the deep N+ drain sinker 14 which, if contacted, would result in a much lower lateral breakdown. In addition, the P well 27 can be extended under the active area (non-LOCOS) which results in a slightly smaller design than if a junction extension were self-aligned to the LOCOS as is more commonly used.

Turning now to FIGS. 5–8, there will be described the simultaneous formation of QVDMOS, CMOS, and bipolar devices. With reference to FIG. 5, a P-type substrate 11 is fabricated to have one or more N+ buried layers 26. A typical N+ buried layer is formed by implanting the surface of the P-type substrate with arsenic (As75) in a dose of $1.25 \times 10^{16}$ atoms/cm$^2$ with an implant energy of 40 KeV. The N+ buried layers 26 are separated by buried P+ regions 44. The P+ buried regions are formed by an ion implant using boron (B11) with a dose of $1.3 \times 10^{15}$ atoms/cm$^2$ at an implant energy of 30 KeV. An N epitaxial layer 13 is grown on the P-type substrate 11. The surface 15 of the epitaxial layer 13 is suitably masked and deep N+ regions are made to form regions 14, 75 in the surface 15 and contacting the N+ buried layer 26. Thereafter, the sinker diffusion mask is stripped and a P well oxide mask 38 is applied to the surface 15. Suitable openings are made in the masking oxide 38 for the formation of a P well 37 for the NMOS device and a P well 27 for the source drain determination of the QVDMOS device. A suitable implant is made, typically using boron 11 with a dose of $1.0 \times 10^{13}$ atoms/cm$^2$ at an energy of 100 KeV, and the implant is driven in to form the P wells 37, 27. Accordingly, in a single step P wells are formed for CMOS devices as well as for QVDMOS source drain terminations. The sinker also forms the collector diffusion for an NPN transistor.

Next, suitable openings are made for P+ isolation regions 47 that are subsequently covered by LOCOS oxide 25. The regions 47 are formed by masking the substrate and exposing selected isolation areas over the buried P+ regions 44. The selected areas are implanted with boron (B11) having a dose of $1.0\times10^{16}$ atoms/cm$^2$ with an energy of 50 KeV. The surface 15 is subsequently treated to provide a gate oxide 32 (not shown) and gates 24, 45, 46 for the QVDMOS and CMOS devices. Thus, the gate oxide for all the MOS devices is formed in one step and the gate metal for all MOS devices is formed in one step. After formation of the gates 24, 45, 46 the surface 15 is implanted with a lightly doped P-type implant such as boron. This P-type implant provides the body region 34 of the DMOS device, as well as the termination drain extension 16. That implant is formed with boron 11 having a dose of $5.6\times10^{13}$ atoms/cm$^2$ and an implant energy of 100 KeV. The same light P implant is used to form the lightly doped section 54 of the drain in the PMOS device. Accordingly, both the DMOS body and the lightly doped drain sections of the PMOS devices are simultaneously formed in one step. Those skilled in the art will appreciate that the surface 15 is suitably masked with photoresist of a suitable thickness in order to provide a barrier for the P-type ions from entering unwanted portions of the surface 15 of the substrate 11.

Figure 7:
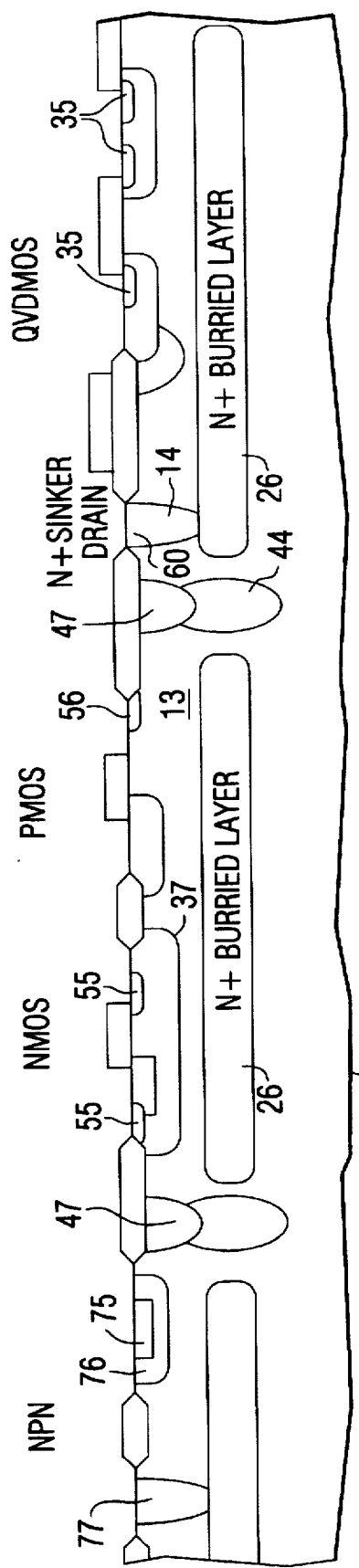
FIG. 7 is a cross-sectional view similar to FIG. 6 showing the simultaneous formation of the QVDMOS sources, NMOS source and drains, and PMOS body tie.

In a following step, a shallow N+ implant is used to form the NMOS source and drain 55, the PMOS body tie 56, and the QVDMOS sources 35 as well as the QVDMOS drain contact 60 to the drain sinker 14. This step is shown in FIG. 7. The implant is arsenic (As75) with a dose of $7.0\times10^{15}$ atoms/cm$^2$ at an energy of 150 KeV. Likewise, the shallow, N+ implant is used to form the emitter 75 of the NPN transistor.

Figure 8:
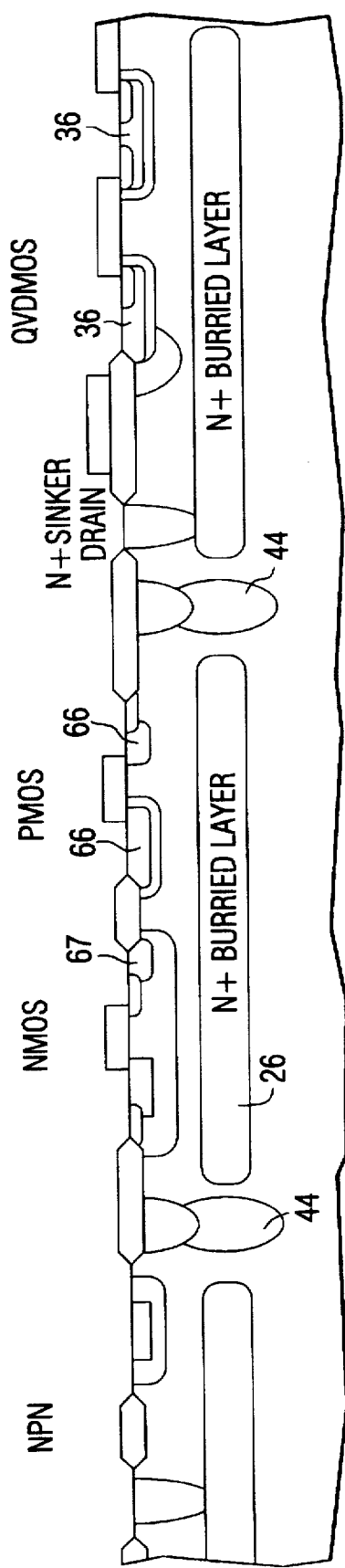
FIG. 8 is a cross-sectional view similar to FIG. 7 showing the simultaneous formation of NMOS body tie, PMOS source and drain, and QVDMOS body tie using a shallow P+ implant.

Next, as shown in FIG. 8, a shallow P-type dopant such as boron is used to form the body ties 36 of the QVDMOS and thereby shunt the QVDMOS body resistance 34 to suppress snapback. The shallow P implant is boron (B11) having a dose of $3.0\times10^{15}$ atoms/cm$^2$ and having an implant energy of 60 KeV. At the same time, the P-type doping forms the sources and drains 66 for the PMOS device and the body tie 67 for the NMOS device. Accordingly, the single shallow P+ implant simultaneously forms the body ties, a portion of the drain extension, the PMOS sources and drains, and the NMOS body tie for the BICMOS device.

Those skilled in the art will appreciate that further steps are employed to complete the fabrication of a BICMOS device including a QVDMOS array, CMOS devices and bipolar devices. These further steps include the steps of siliciding the sources, drains and polysilicon gate regions, and emitter and base contacts; providing one or more suitable layers of interlevel metal dielectric isolation; and providing one or more layers of metal for contacting the terminals of the different devices including contacts for the sources, drains, gates, bases, emitters and collectors. Such further steps have been described above and are otherwise known to those skilled in the art.

What I claim:

1. An integrated circuit comprising a quasi-vertical DMOS (QVDMOS) transistor comprising:

a substrate of a first type of conductivity;

a buried layer in said substrate of a second type of conductivity opposite in polarity to the first type and heavily doped;

an epitaxial layer of a second type of conductivity on said substrate and over said buried layer;

a drain region extending from the surface of the epitaxial layer to the buried layer and having a second type of conductivity;

a body region formed in the surface of the epitaxial layer, spaced from said drain region and having a first type of conductivity;

a source region formed in said body region, having a shallow depth and having a second type of conductivity;

a body tie formed in the source region, having a first type of conductivity, a conductivity greater than the conductivity of the body region a depth slightly greater than the depth of the source region and extending under and not beyond the source region;

a gate insulated from the epitaxial layer and extending over the source and body regions.

2. The integrated circuit of claim 1 wherein the QVDMOS transistor comprises an annular source region.

3. The integrated circuit of claim 1 wherein the QVDMOS transistor comprises a body tie disposed within the source region.

4. The integrated circuit of claim 1 wherein the source and body tie are silicided.

5. The integrated circuit of claim 1 wherein the source and body tie are self-aligned with the gate.

6. The integrated circuit of claim 1 wherein the gate comprises a dielectric layer in contact with the surface of the epitaxial layer and a conductive layer in contact with the dielectric layer.

7. The integrated circuit of claim 1 wherein the body tie region and the source region have a high conductivity and the body tie region serves as a low resistance path between the body region and the surface of the epitaxial layer.

8. A QVDMOS transistor comprising:

a semiconductor substrate;

a body region formed in the surface of the substrate and having a first type of conductivity;

a source region formed in said body region, having a shallow depth and having a second type of conductivity opposite in polarity to the first type;

a drain region having a second type of conductivity;

a body tie formed in the drain region, having a first conductivity greater than the conductivity of the body region a depth slightly greater than the depth of the source region and extending under and not beyond the source region; and a gate insulated from the epitaxial layer and extending over the source and body regions.

9. The integrated circuit of claim 8 wherein the QVDMOS transistor comprises an annular source region.

10. The integrated circuit of claim 9 wherein the QVDMOS transistor comprises a body tie disposed within the annular source region.

11. The integrated circuit of claim 8 wherein the source and body tie are silicided.

12. The integrated circuit of claim 8 wherein the source and body tie are self-aligned with the gate.

13. The integrated circuit of claim 8 wherein the gate comprises a dielectric layer in contact with the surface of the epitaxial layer and a conductive layer in contact with the dielectric layer.

14. The integrated circuit of claim 8 wherein the body tie and the source region have a high conductivity and the body tie serves as a low resistance path between the body region and the surface of the epitaxial layer.

15. A QVDMOS transistor in the surface of a semiconductor substrate and having a drain, a buried layer in contact with the drain, a gate with an opening defining a body region, said body region disposed over the buried layer and comprising a source wherein the body region is of a first type of conductivity and the source is of a second type of conductivity opposite in polarity to the first type, an improvement comprising a body tie enclosed at the surface by the source and disposed below the source and extending radially outward and not beyond the source region said body tie having a first type of conductivity and having a greater conductivity than the body region.

16. The QVDMOS transistor of claim 15 wherein the source and body tie are silicided.

17. The integrated circuit of claim 1 wherein the integrated circuit further comprises a surface oxide region, a second body region of a first type of conductivity disposed between the oxide region and the gate, and a well region of a first conductivity type disposed below and in contact with the oxide region and the second body region.

18. The integrated circuit of claim 17 wherein the well region establishes a breakdown voltage of up to 80 volts.

19. The QVDMOS transistor of claim 8 further comprising a surface oxide region, a second body region of a first type of conductivity disposed between the oxide region and the gate, and a well region of a first conductivity type disposed below and in contact with the oxide region and the second body region.

20. The QVDMOS transistor of claim 19 wherein the well region increases the breakdown voltage.

21. The QVDMOS transistor of claim 15 wherein the integrated circuit further comprises a surface oxide region, a second body region of a first type of conductivity disposed between the oxide region and the gate, and a well region of a first conductivity type disposed below and in contact with the oxide region and the second body region.

22. The QVDMOS transistor of claim 21 wherein the well region increases the breakdown voltage.

* * * * *